(12) United States Patent
Ariga et al.

(10) Patent No.: US 10,811,840 B2
(45) Date of Patent: Oct. 20, 2020

(54) LASER MODULE

(71) Applicant: FURUKAWA ELECTRIC CO., LTD., Tokyo (JP)

(72) Inventors: Maiko Ariga, Tokyo (JP); Yusuke Inaba, Tokyo (JP); Kazuaki Kiyota, Tokyo (JP); Toshihito Suzuki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/053,850

(22) Filed: Aug. 3, 2018

(65) Prior Publication Data

US 2018/0342850 A1 Nov. 29, 2018

Related U.S. Application Data

(63) Continuation of application No. PCT/JP2017/004970, filed on Feb. 10, 2017.

(30) Foreign Application Priority Data

Feb. 12, 2016 (JP) .................................. 2016-025076

(51) Int. Cl.
*H01S 5/026* (2006.01)
*H01S 5/022* (2006.01)
(Continued)

(52) U.S. Cl.
CPC .......... *H01S 5/0262* (2013.01); *H01S 5/0206* (2013.01); *H01S 5/02248* (2013.01);
(Continued)

(58) Field of Classification Search
CPC ... H01S 5/1082–1085; H01S 5/50–509; H01S 5/101; H01S 5/0064; H01S 5/1021; H01S 5/1025

See application file for complete search history.

(56) References Cited

U.S. PATENT DOCUMENTS 6,671,298 B1 * 12/2003 Delfyett .................... H01S 5/14
372/26
8,665,919 B2 * 3/2014 Kimoto ................ G02B 6/2808
372/20
(Continued)

FOREIGN PATENT DOCUMENTS

CN 1366368 A 8/2002
CN 102362400 A 2/2012
(Continued)

OTHER PUBLICATIONS

International Search Report dated Apr. 25, 2017 in PCT/JP2017/004970 filed Feb. 10, 2017 (with English Translation).
(Continued)

*Primary Examiner* — Joshua King
(74) *Attorney, Agent, or Firm* — Oblon, McClelland, Maier & Neustadt, L.L.P.

(57) ABSTRACT

A laser module that can suppress influence due to a reflected light between chips is provided. A laser module 100 according to one embodiment of the present invention includes: a laser element 110 provided on a first substrate and having a laser oscillation unit that generates a laser light and a first optical waveguide that guides the laser light; and an optical amplifier 120 provided on a second substrate and having a second waveguide that guides the laser light. The first optical waveguide is nonparallel relative to an end face of the first substrate and connected thereto, the second optical waveguide is nonparallel relative to an end face of the second substrate and connected thereto, and the first substrate and the second substrate are arranged such that the laser light output from the first optical waveguide is optically coupled to the second optical waveguide.

15 Claims, 15 Drawing Sheets

(51) Int. Cl.
*H01S 5/10* (2006.01)
*H01S 5/02* (2006.01)
*H01S 5/024* (2006.01)
*H01S 5/125* (2006.01)
*H01S 5/14* (2006.01)
*H01S 5/028* (2006.01)
*H01S 5/00* (2006.01)
*H01S 5/50* (2006.01)
*H01S 5/0687* (2006.01)

(52) U.S. Cl.
CPC .......... *H01S 5/02415* (2013.01); *H01S 5/101* (2013.01); *H01S 5/1085* (2013.01); *H01S 5/125* (2013.01); *H01S 5/141* (2013.01); *H01S 5/005* (2013.01); *H01S 5/0064* (2013.01); *H01S 5/0071* (2013.01); *H01S 5/0287* (2013.01); *H01S 5/02288* (2013.01); *H01S 5/0687* (2013.01); *H01S 5/1025* (2013.01); *H01S 5/50* (2013.01)

(56) References Cited

U.S. PATENT DOCUMENTS

| | | | |
|---|---|---|---|
| 9,088,132 B2 * | 7/2015 | Kiyota | B82Y 20/00 |
| 2002/0176476 A1 * | 11/2002 | Vakhshoori | H01S 5/50 372/101 |
| 2003/0099440 A1 * | 5/2003 | Kim | H01S 5/50 385/50 |
| 2010/0215072 A1 * | 8/2010 | Funabashi | G02B 6/42 372/50.12 |
| 2010/0245990 A1 * | 9/2010 | Tanaka | H01S 5/50 359/344 |
| 2011/0051143 A1 * | 3/2011 | Flanders | H01S 5/5018 356/451 |
| 2011/0090557 A1 * | 4/2011 | Ide | G02B 6/42 359/332 |
| 2012/0099611 A1 | 4/2012 | Kim et al. | |
| 2012/0281723 A1 * | 11/2012 | Oh | H01S 5/02248 372/20 |
| 2014/0055842 A1 * | 2/2014 | Kiyota | H01S 5/101 359/341.1 |
| 2014/0064306 A1 * | 3/2014 | Yoon | H01S 5/026 372/20 |
| 2014/0285876 A1 * | 9/2014 | Yoshida | H01S 5/1064 359/341.3 |
| 2015/0103853 A1 * | 4/2015 | Kurobe | H01S 5/50 372/34 |
| 2015/0184994 A1 | 7/2015 | Flanders | |
| 2015/0288148 A1 * | 10/2015 | Takabayashi | H01S 5/125 372/6 |
| 2018/0269659 A1 * | 9/2018 | Ishii | H01S 5/022 |

FOREIGN PATENT DOCUMENTS

| | | |
|---|---|---|
| CN | 102629732 A | 8/2012 |
| CN | 103248426 A | 8/2013 |
| CN | 104081598 A | 10/2014 |
| CN | 204258035 U | 4/2015 |
| JP | 2001-111177 | 4/2001 |
| JP | 2011-211010 | 10/2011 |
| JP | WO 2013/180291 A1 | 12/2013 |
| WO | WO 2010/143763 A1 | 12/2010 |
| WO | WO-2011051723 A1 * 5/2011 ........... H01S 5/5018 |

OTHER PUBLICATIONS

Written Opinion dated Apr. 25, 2017 in PCT/JP2017/004970 filed Feb. 10, 2017.
Combined Chinese Office Action and Search Report dated Oct. 8, 2019 in corresponding Chinese Patent Application No. 201780010945.3 (with English Translation and English Translation of Category of Cited Documents), 16 pages.
The Second Office Action dated Jul. 7, 2020, in the counterpart Chinese application No. 201780010945.3 and the English translation thereof.

* cited by examiner

LASER MODULE

CROSS-REFERENCE TO RELATED APPLICATIONS

This application is a continuation application of International Application No. PCT/JP2017/004970, filed Feb. 10, 2017, which claims the benefit of Japanese Patent Application No. 2016-025076, filed Feb. 12, 2016. The contents of the aforementioned applications are incorporated herein by reference in their entireties.

TECHNICAL FIELD

The present invention relates to a laser module that outputs a laser light.

BACKGROUND ART

Conventionally, a laser module in which a laser element that generates a laser light and an optical amplifier that amplifies a laser light are integrated on a signal chip is known. The wavelength of a laser light oscillated at the laser element varies in accordance with a temperature, and the optical amplifier generates heat due to amplification of the laser light. Thus, a laser module has a temperature adjustment element such as a Peltier element in general and can control the temperature of the laser element so that a laser light of a desired wavelength is oscillated and cool the heated optical amplifier.

In recent years, since there is a demand for increased output power for laser modules and a laser element and an optical amplifier are driven by a large current, the amount of heat generated from the laser element and the optical amplifier has increased. In a configuration in which a laser element and an optical amplifier are integrated on a single chip as described above, temperature adjustment for both temperature control for wavelength adjustment of a laser element and cooling of heat generation of an optical amplifier, which has been made by two temperature adjustment elements, is required to be performed by a single temperature adjustment element due to an increase in the amount of heat generation. Therefore, the current value required to control the temperature adjustment element becomes significantly high and exceeds the current capacity of a power source resulting in inability of control.

Patent Literature 1 discloses an art that provides a laser element and an optical amplifier on two different support members and performs temperature adjustment on the two support members by using separate temperature adjustment elements. According to such a configuration, thermal transfer between the laser element and the optical amplifier can be suppressed, and temperatures of the laser element and the optical amplifier can be independently controlled by the separate temperature adjustment elements. Thus, the laser element and the optical amplifier can be adjusted to appropriate temperatures, respectively.

CITATION LIST

Patent Literature

Patent Literature 1: International Publication No. WO2013/180291

SUMMARY OF INVENTION

Technical Problem

The inventors have found that, when a laser element and an optical amplifier are arranged separately on different chips as seen in the art of Patent Literature 1, a reflected light inside the end face of the chip of the laser element or outside the end face of the chip of the optical amplifier returns to the laser element, and noise occurs resulting in deteriorated laser characteristics. Further, the inventors have found that a laser light is also reflected inside the end face of the chip of the optical amplifier and unintended laser oscillation occurs within the chip and thus the laser characteristics are further deteriorated. Even when an optical isolator for removing a reflected light is provided between two chips, reflected lights within respective chips cannot be removed.

The present invention has been made in view of the problem described above and intends to provide a laser module that can suppress influence due to a reflected light between chips.

Solution to the Problem

One aspect of the present invention is a laser module including: a laser element provided on a first substrate and having a laser oscillation unit that generates a laser light and a first optical waveguide that guides the laser light; and an optical element provided on a second substrate and having a second optical waveguide that guides the laser light, the first optical waveguide is nonparallel relative to an end face of the first substrate and connected to the end face of the first substrate, and the first substrate and the second substrate are arranged such that the laser light output from the first optical waveguide is optically coupled to the second optical waveguide.

Advantageous Effects of Invention

In the laser module according to the present invention, the laser element and the optical element are provided on different substrates, and at least the optical waveguide forming the laser element is nonparallel relative to the end face of the substrate and connected thereto. Such a configuration can suppress a reflected light at the end face of the substrate from returning to the optical waveguide and affecting the laser light.

DESCRIPTION OF EMBODIMENTS

Figure 1:
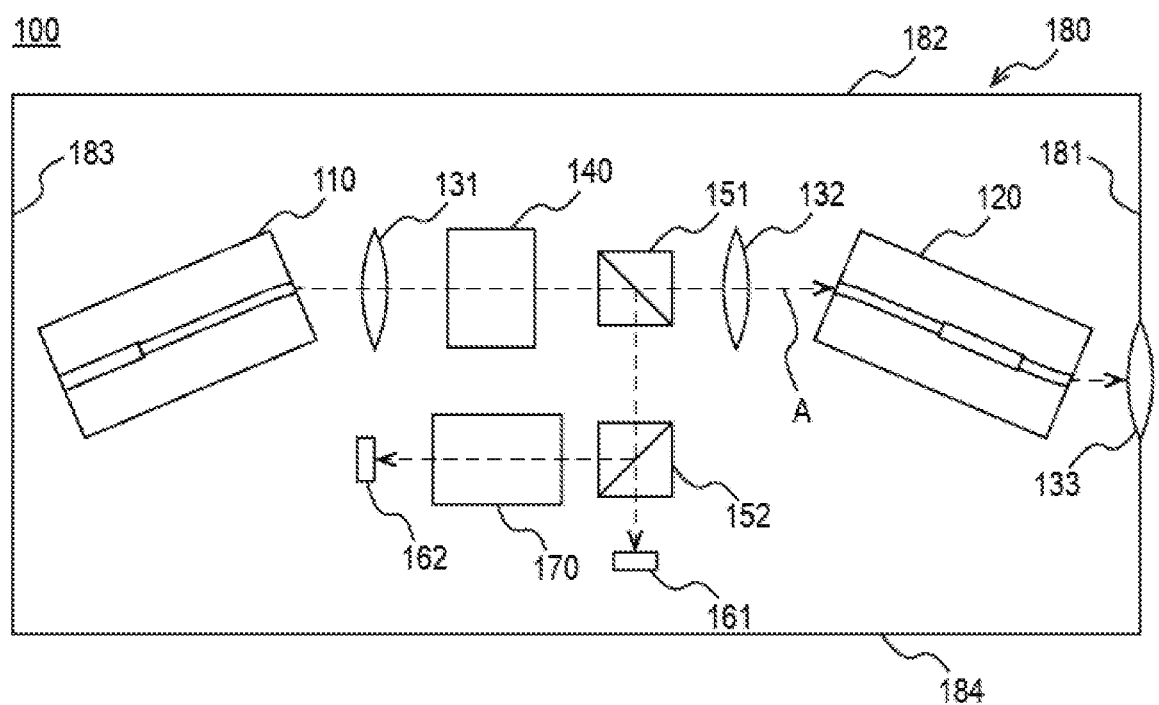
FIG. 1 is a general configuration diagram of a laser module according to a first embodiment.

While embodiments of the present invention will be described below with reference to the drawings, the present invention is not limited to the present embodiments. Note that, in the drawings described below, components having the same function are labeled with the same reference numerals, and the repeated description thereof may be omitted.

First Embodiment

FIG. 1 is a general configuration diagram of a laser module 100 according to the present embodiment. The laser module 100 has a laser element 110, an optical amplifier 120, a collimate lens 131, condensing lenses 132 and 133, an optical isolator 140, optical splitters 151 and 152, photodiodes 161 and 162, and an etalon filter 170 within a casing 180 (package). Each member within the laser module 100 is connected to a not-shown control unit, and power supply and behavior control of the laser module 100 are performed by the control unit.

The laser element 110 generates and outputs a laser light A. The detailed configuration of the laser element 110 will be described later by using FIG. 2.

The collimate lens 131 is provided in a direction in which the laser element 110 outputs the laser light A and converts the laser light A output from the laser element 110 into a parallel light. The optical isolator 140 is provided in a direction in which the collimate lens 131 outputs the laser light A. The optical isolator 140 passes a light in a direction toward the optical amplifier 120 from the laser element 110 and blocks a light in the reverse direction. As the optical isolator 140, a known configuration may be used, for example, a configuration in which a Faraday rotator is provided between two polarizers may be used.

The optical splitter 151 is provided in a direction in which the optical isolator 140 outputs the laser light A. The optical splitter 151 divides the incident laser light A into two directions at a predetermined ratio. As the optical splitter 151, a half mirror or other beam splitters may be used, for example.

The condensing lens 132 is provided in one of the directions in which the optical splitter 151 outputs the laser light A. The condensing lens 132 condenses and optically couples the laser light A into the optical waveguide of the optical amplifier 120.

The optical amplifier 120 is an optical element which is not a laser element. The optical amplifier 120 is provided in a direction in which the condensing lens 132 outputs the laser light A and amplifies and outputs the laser light A. The detailed configuration of the optical amplifier 120 will be described later by using FIG. 5.

The condensing lens 133 is provided on a sidewall 181 of the casing 180 in a direction in which the optical amplifier 120 outputs the laser light A. The condensing lens 133 condenses the laser light A output from the optical amplifier 120 to the outside of the casing 180.

The optical splitter 152 is provided in the other direction in which the optical splitter 151 outputs the laser light A. The optical splitter 152 divides the incident laser light A into two directions at a predetermined ratio. As the optical splitter 152, a half mirror or other beam splitters may be used, for example.

The etalon filter 170 is provided in one of the directions in which the optical splitter 152 outputs the laser light A. The etalon filter 170 is provided for wavelength lock control that controls the wavelength of the laser light A generated by the laser element 110 to a predetermined value. The etalon filter 170 has a periodical transmission property with respect to wavelengths.

The photodiode 161 is provided in the other direction in which the optical splitter 152 outputs the laser light A. The photodiode 161 detects the intensity of the laser light A which has not passed through the etalon filter 170. On the other hand, the photodiode 162 is provided in a direction in which the etalon filter 170 outputs the laser light A. The photodiode 162 detects the intensity of the laser light A which has passed through the etalon filter 170. A not-shown control unit controls power supplied to the laser element 110 so that the intensity of the laser light A detected by the photodiode 161 and the intensity of the laser light A detected by the photodiode 162 become at a predetermined ratio. With such a configuration, the wavelength of the laser light A generated by the laser element 110 can be controlled to a predetermined value.

The casing 180 has four sidewalls 181, 182, 183, and 184 surrounding the sides of all the members in the laser module 100 and has a top wall and a bottom wall covering the upper side and the underside of all the members. In FIG. 1, the top wall and the bottom wall are not depicted for better visibility. An opening may be provided in at least a part of the sidewalls 181, 182, 183, and 184, the top wall, and the bottom wall and configured such that the inner space of the casing 180 communicates with the outer space via the opening.

The configuration of the laser module 100 illustrated in FIG. 1 is an example and may be changed as appropriate. For example, the optical isolator 140, and the etalon filter 170, and other optical systems may be omitted or may be replaced with other configurations having similar functions. Further, the laser module 100 may be provided with an additional optical element such as an optical modulator, an optical switch, or the like, an optical system such as a lens, an optical splitter, or the like.

Figure 2:
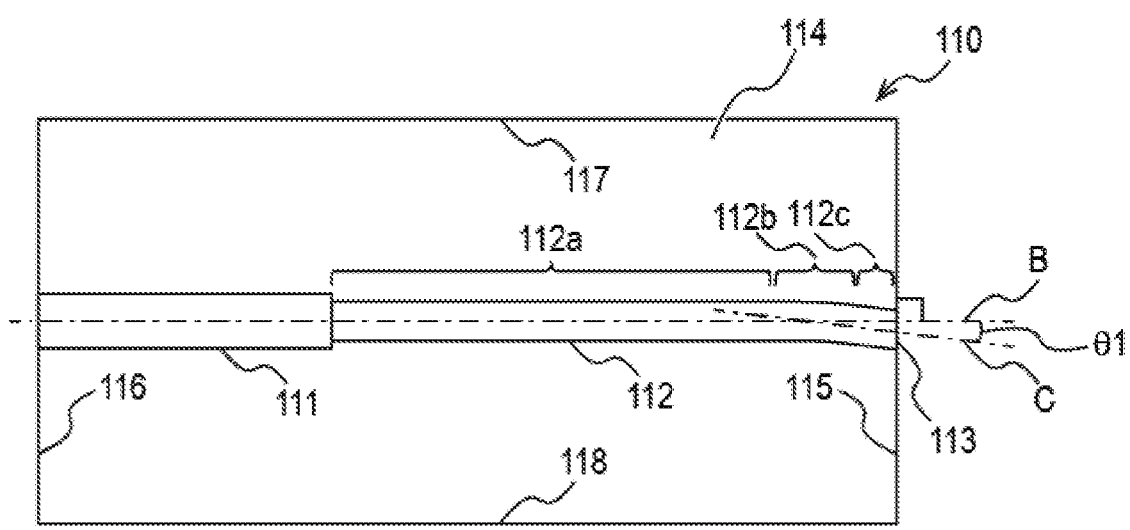
FIG. 2 is a general configuration diagram of a laser element according to the first embodiment.

FIG. 2 is a general configuration diagram of the laser element 110 according to the present embodiment. The laser element 110 has a laser oscillator 111 and an optical waveguide 112 (first optical waveguide) on a substrate 114 (first substrate). The substrate 114 is arranged on a temperature adjustment element (not shown) such as a Peltier element in order to adjust (cool) the temperature of the laser element 110.

The substrate 114 has a planar shape and has four end faces 115, 116, 117, and 118 surrounding the circumference of the planar shape. The first end face 115 and the second end face 116 are provided so as to face each other. The third end face 117 and the fourth end face 118 face each other and are provided so as to connect the first end face 115 to the second end face 116. As the substrate 114, any substrate may be used, such as an Si substrate, a quartz substrate, an InP substrate, or the like, in which an optical waveguide can be formed inside or on the surface thereof.

The laser oscillation unit 111 is provided such that the longitudinal direction thereof (that is, the traveling direction of a laser light) extends along the third end face 117 and the fourth end face 118. In the present embodiment, the laser oscillation unit 111 is a semiconductor laser, more specifically, a distributed feedback (DFB) laser, a distributed reflector (DR) laser, or a distributed Bragg reflector (DBR) laser. The laser oscillation unit 111 has a stripe optical waveguide including an active layer and, in response to power being supplied thereto, generates a laser light. The wavelength of the generated laser light is a wavelength within a range used for optical communication (for example, 1260 nm to 1675 nm) and may include one or a plurality of wavelengths. As the laser oscillation unit 111, any configuration that can output a laser light may be used without being limited to those illustrated herein.

The optical waveguide 112 is provided such that the longitudinal direction thereof (that is, the traveling direction of a laser light) extends along the third end face 117 and the fourth end face 118 and has an output port 113 used for outputting a laser light on the first end face 115. The optical waveguide 112 is formed inside or the surface of the substrate 114 by using Si, quartz, InP, or the like, for example. The optical waveguide 112 guides a laser light generated at the laser oscillation unit 111 to the output port 113.

The optical waveguide 112 has a first linear part 112a, a curved part 112b, and a second linear part 112c in this order from the laser oscillation unit 111 to the output port 113. The first linear part 112a is a linear optical waveguide and optically coupled between the laser oscillator 111 and the curved part 112b. The first linear part 112a extends along an axis B (first axis) perpendicular to the first end face 115 (output end face) on which the output port 113 is provided. The second linear part 112c is a linear optical waveguide and optically coupled between the curved part 112b and the output port 113. The second linear part 112c extends along an axis C (third axis) nonparallel at a predetermined angle relative to the axis B.

The curved part 112b is a bent optical waveguide. The bending radius of the curved part 112b is less than or equal to a tolerable bending radius of the optical waveguide 112. The curved part 112b is bent so as to set the angle between the first linear part 112a and the second linear part 112c to an angle $\theta 1$ (first angle). In other words, the axis C of the second linear part 112c, which is a portion where the optical waveguide 112 is connected to the output end face 115, is nonparallel at the angle $\theta 1$ relative to the axis B that is perpendicular to the output end face 115. The angle $\theta 1$ is an angle larger than 0 degree, and the preferable range thereof will be described later.

A low reflection coating with known design is applied to the output end face 115. This low reflection coating may be made of a multilayered film of dielectrics. Further, it is preferable for the coating to be designed under the condition of the incidence angle being $\theta 1$. With a low reflection coating, reflection at the output end face 115 can be reduced. Since it is difficult to strictly control the refractive index or the thickness of the dielectric, however, it is not required to control the reflection to zero in the actual implementation.

Figure 3:
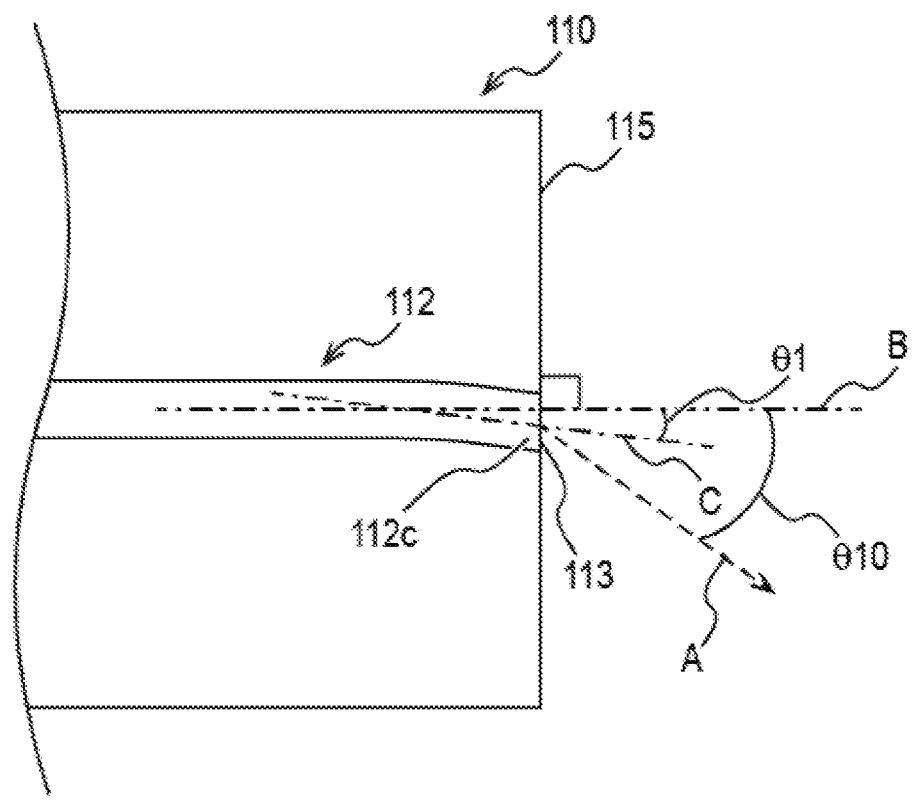
FIG. 3 is a schematic diagram illustrating an angle of a laser light output from the laser element according to the first embodiment.

FIG. 3 is a schematic diagram illustrating the angle of the laser light A output from the laser element 110. FIG. 3 illustrates an exploded view of a portion including the output port 113 in FIG. 2. Since the optical waveguide 112 (the second linear part 112c) is connected to the output end face 115 nonparallel at the angle $\theta 1$ relative to the axis B perpendicular to the output end face 115, the laser light A traveling in the optical waveguide 112 enters the output end face 115 at a non-perpendicular angle. Thus, the laser light A is refracted due to a refractive index difference between the optical waveguide 112 and the external space (for example, nitrogen) and is emitted from the laser element 110. Specifically, the laser light A is emitted in a direction of an angle $\theta 10$ (third angle) relative to the axis B perpendicular to the output end face 115. The angle $\theta 10$ of the emission of the laser light A changes depending on the $\theta 1$ at which the optical waveguide 112 is connected to the output end face 115 and is a value larger than the angle $\theta 1$ when the external space of the laser element 110 is nitrogen or air.

With an optical waveguide being connected to an end face perpendicularly as seen in the art disclosed in Patent Literature 1, a reflected light at the end face will enter the optical waveguide in a reverse direction. In contrast, in the laser element 110 according to the present embodiment, the optical waveguide 112 is nonparallel at a predetermined angle relative to the output end face 115 and connected thereto, the laser light A reflected at the output end face 115 travels in a direction different from the optical waveguide 112 within the substrate 114. This can suppress a reflected light at the output end face 115 from generating a return optical noise.

Figure 4:
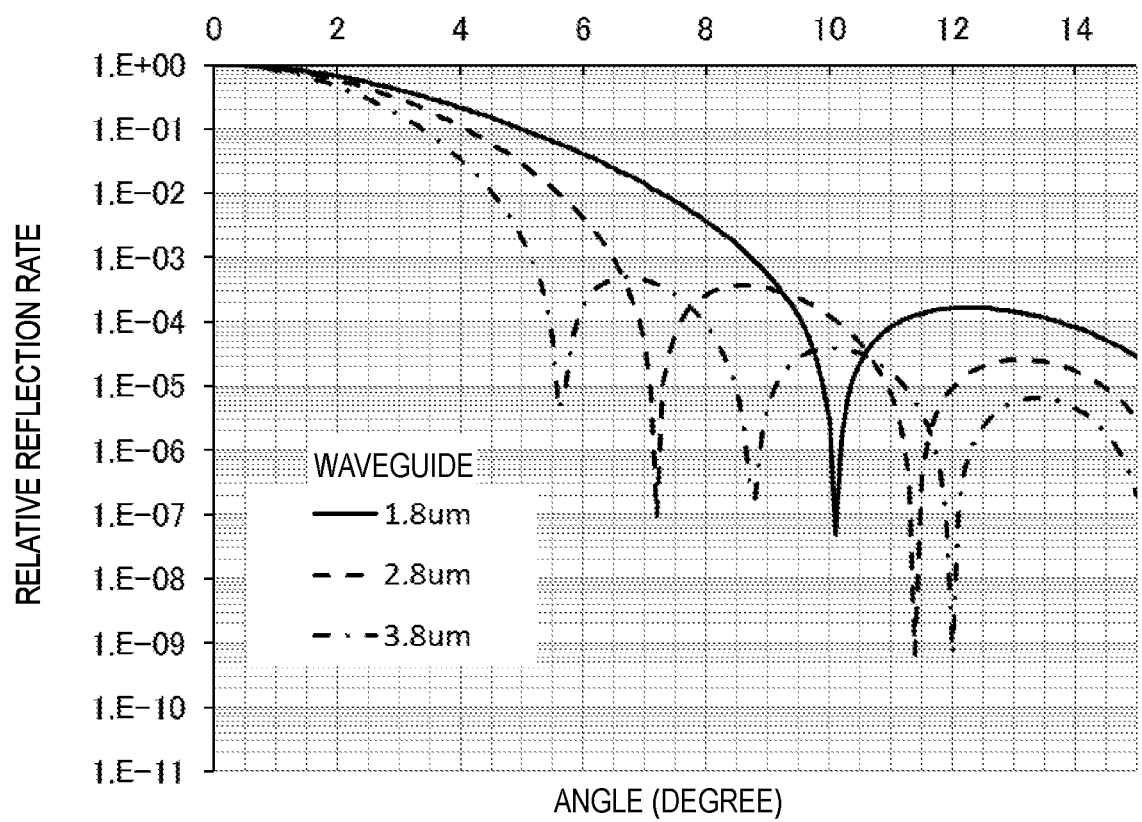
FIG. 4 is a diagram illustrating a graph of an angle and a relative reflection ratio of an optical waveguide according to the first embodiment.

FIG. 4 is a diagram illustrating a graph of the angle $\theta 1$ and a relative reflection ratio of the optical waveguide 112. In FIG. 4, the horizontal axis represents the angle $\theta 1$ at which the optical waveguide 112 is connected to the output end face 115, and the vertical axis represents a relative reflection ratio at the output end face 115. This relative reflection ratio is a value resulted by calculating how much a light reflected at the output end face 115 returns to the optical waveguide, and the actual reflection ratio is a product of this relative reflection ratio and an end face reflection ratio when there is a coating film. FIG. 4 illustrates three logarithm graphs where the width of the optical waveguide 112 is set to 1.8 µm, 2.8 µm, or 3.8 µm. As can be understood from FIG. 4, for all the waveguide widths, the larger the angle $\theta 1$ is, the smaller the relative reflection ratio tends to be. This is because a larger angle causes a reflected light to be directed to a direction more different from an orientation of the optical waveguide and therefore, even when there is a reflection, it no longer couples to the optical waveguide. Thus, the larger the angle $\theta 1$ is, the more the reflection amount of the laser light A decreases, which can more effectively suppress a reflected light at the output end face 115 from returning to the optical waveguide 112.

Specifically, it is desirable that the angle $\theta 1$ of the optical waveguide 112 relative to the axis B perpendicular to the output end face 115 be greater than 3 degrees and less than 18.4 degrees. In this case, the emission angle $\theta 10$ of the laser light A ranges from an angle greater than 9 degrees to an angle less than 90 degrees. With the angle $\theta 1$ is less than or equal to 3 degrees, the reflected light at the output end face 115 may return to the optical waveguide 112 within the substrate 114. Further, with the angle θ1 being greater than or equal to 18.4 degrees, the emission angle θ10 of the laser light A becomes greater than or equal to 90 degrees, and the laser light A may not be emitted from the laser element 110.

Figure 5:
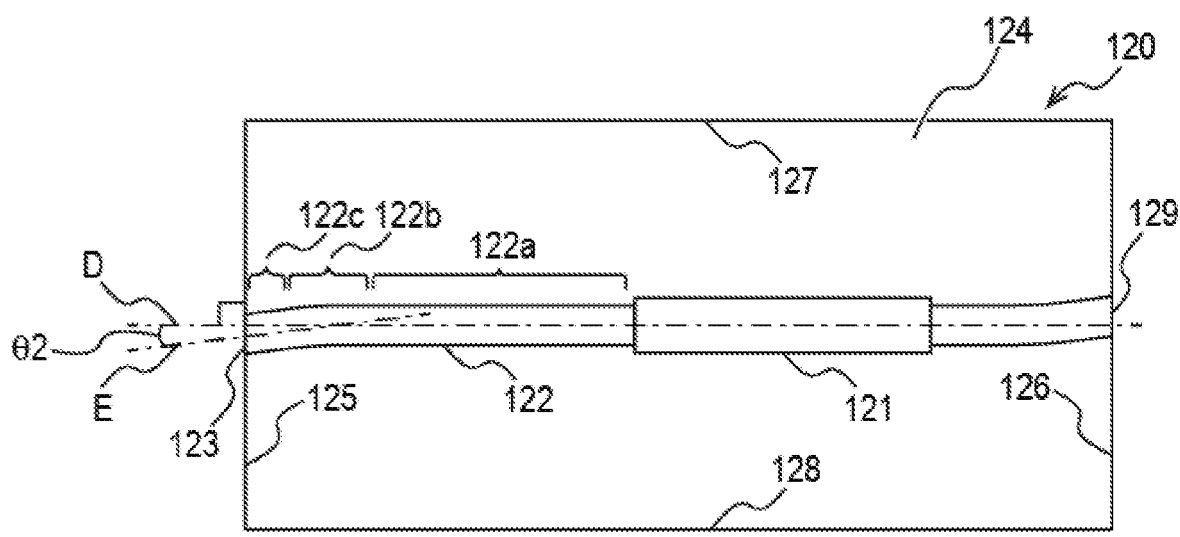
FIG. 5 is a general configuration diagram of an optical amplifier according to the first embodiment.

FIG. 5 is a general configuration diagram of the optical amplifier 120 according to the present embodiment. The optical amplifier 120 has an optical amplifier unit 121 and an optical waveguide 122 (second optical waveguide) on a substrate 124 (second substrate). The substrate 124 is arranged on a temperature adjustment element (not shown) such as a Peltier element for adjusting (cooling) the temperature of the optical amplifier 120.

The substrate 124 has a planar shape and has four end faces 125, 126, 127, and 128 surrounding the circumference of the planar shape. The first end face 125 and the second end face 126 are provided so as to face each other. The third end face 127 and the fourth end face 128 face each other and are provided so as to connect the first end face 125 to the second end face 126. As the substrate 124, any substrate may be used, such as an Si substrate, a quartz substrate, an InP substrate, or the like, in which an optical waveguide can be formed inside or on the surface thereof.

The optical amplifier unit 121 is provided such that the longitudinal direction thereof (that is, the traveling direction of a laser light) extends along the third end face 127 and the fourth end face 128. In the present embodiment, the optical amplifier unit 121 is a semiconductor optical amplifier (SOA). The optical amplifier unit 121 has the mesa structure including an active layer of multi-quantum well-separate confined hetero structure (MQW-SCH) made of InGaAsP and amplifies a laser light passing therein when power is supplied. The amplified laser light is emitted to the outside of the optical amplifier 120. As the optical amplifier unit 121, any configuration that can amplify a laser light may be used without being limited to those illustrated herein.

The optical waveguide 122 is provided such that the longitudinal direction thereof (that is, the traveling direction of a laser light) extends along the third end face 127 and the fourth end face 128, has an input port 123 used for receiving a laser light from the laser element 110 on the first end face 125, and has an output port 129 used for outputting the amplified laser light on the second end face 126. The optical waveguide 122 is formed inside or the surface of the substrate 124 by using Si, quartz, InP, or the like, for example. The optical waveguide 122 guides a laser light input from the input port 123 to the optical amplifier unit 121.

The optical waveguide 122 has a first linear part 122a, a curved part 122b, and a second linear part 122c in this order from the optical amplifier unit 121 to the input port 123. The first linear part 122a is a linear optical waveguide and optically coupled between the optical amplifier unit 121 and the curved part 122b. The first linear part 122a extends along an axis D (second axis) perpendicular to the first end face 125 (input end face) on which the input port 123 is provided. The second linear part 122c is a linear optical waveguide and optically coupled between the curved part 122b and the input port 123. The second linear part 122c extends along an axis E (fourth axis) nonparallel at a predetermined angle relative to the axis D.

The curved part 122b is a bent optical waveguide. The bending radius of the curved part 122b is less than or equal to a tolerable bending radius of the optical waveguide 122. The curved part 122b is bent so as to set the angle between the first linear part 122a and the second linear part 122c to an angle θ2 (second angle). In other words, the axis E of the second linear part 122c, which is a portion where the optical waveguide 122 is connected to the input end face 125, is nonparallel at the angle θ2 relative to the axis D that is perpendicular to the input end face 125. The angle θ2 is an angle larger than 0 degree, and the preferable range thereof will be described later.

A low reflection coating with known design is applied to the input end face 125 in the same manner as the output end face 115 of the laser element 110. This low reflection coating may be made of a multilayered film of dielectrics. Further, it is preferable for the coating to be designed under the condition of the incidence angle being θ2. With a low reflection coating, reflection at the input end face 125 can be reduced.

Furthermore, the optical waveguide 122 has the same configuration as the first linear part 122a, the curved part 122b, and the second linear part 122c also in the second end face 126 (output end face) side on which the output port 129 is provided. Thereby, the axis of a portion where the optical waveguide 122 is connected to the output end face 126 is nonparallel at the angle θ2 relative to the axis perpendicular to the output end face 126. The angle θ2 on the input end face 125 side and the angle θ2 on the output end face 126 side may be different angles as long as they are within the preferable range.

Figure 6:
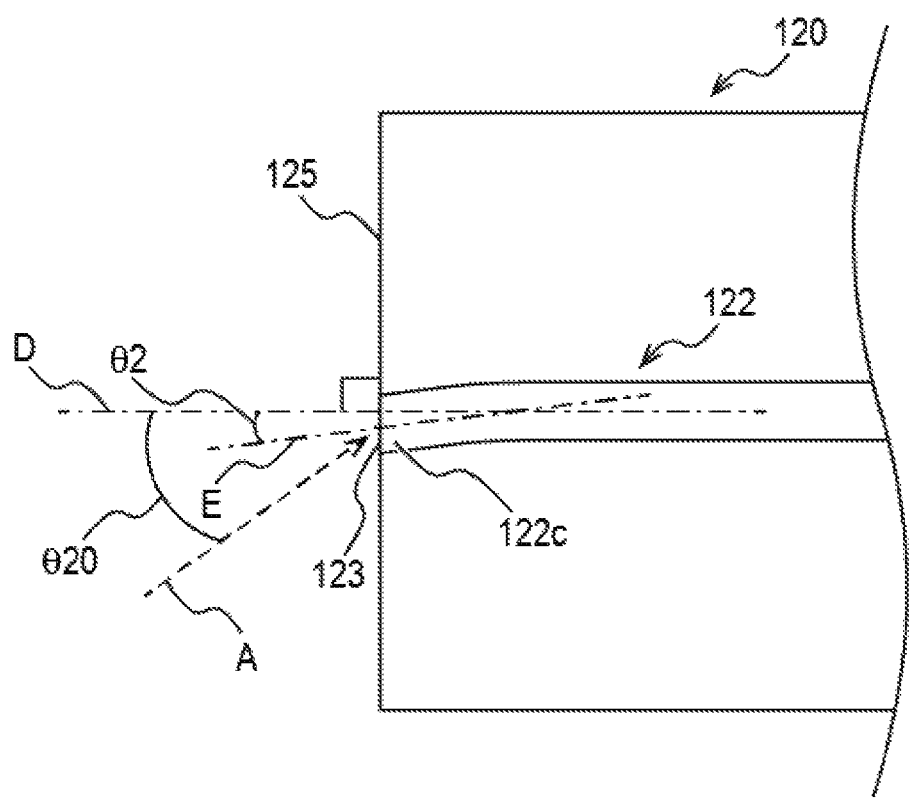
FIG. 6 is schematic diagram illustrating an angle of a laser light input to the optical amplifier according to the first embodiment.

FIG. 6 is a schematic diagram illustrating an angle of the laser light A input to the optical amplifier 120. FIG. 6 illustrates an exploded view of a portion including the input port 123 in FIG. 5. Since the optical waveguide 122 (the second linear part 122c) is connected to the input end face 125 nonparallel at the angle θ2 relative to the axis D perpendicular to the input end face 125. In order that the laser light A from an external space optically couples to the optical waveguide 122, it is necessary for the laser light A to enter the optical waveguide 122 at a predetermined angle in accordance with a refractive index difference between the external space (for example, nitrogen) and the optical waveguide 122. Specifically, the laser light A is required to be incident from a direction at an angle θ20 (fourth angle) relative to the axis D perpendicular to the input end face 125. The angle θ20 of the incidence of the laser light A changes depending on the angle θ2 at which the optical waveguide 122 is connected to the input end face 125 and is a value larger than the angle θ2 when the external space of the optical amplifier 120 is nitrogen or air.

In a similar manner to the laser element 110, in the optical amplifier 120 according to the present embodiment, the optical waveguide 122 is nonparallel at a predetermined angle relative to the input end face 125 and connected thereto, and thereby a light reflected at the input end face 125 travels in a direction different from the optical waveguide 122 within the substrate 124. This can suppress repetition of reflection of the laser light A between the end faces 125 and 126 of the optical amplifier 120 and occurrence of unintended laser oscillation. Furthermore, in the optical amplifier 120 according to the present embodiment, with the optical waveguide 122 being nonparallel at a predetermined angle relative to the output end face 126 and connected thereto, a light reflected at the output end face 126 also travels in a direction different from the optical waveguide 122 within the substrate 124. This can more effectively suppress unintended laser oscillation inside the optical amplifier 120.

As described by using FIG. 4, since a larger angle θ2 of the optical waveguide 122 (axis E of the second linear part 122c) relative to the axis D perpendicular to the input end face 125 tends to result in a smaller relative reflection ratio at the input end face 125, this can reduce influence due to a reflected light. Specifically, it is desirable that the angle θ2 be greater than 3 degrees and less than 18.4 degrees. In this case, the emission angle θ20 of the laser light A ranges from an angle greater than 9 degrees to an angle less than 90 degrees. With the angle θ2 is less than or equal to 3 degrees, the reflected light at the input end face 125 may return to the optical waveguide 122 within the substrate 124. Further, with the angle θ2 being greater than or equal to 18.4 degrees, the incidence angle θ20 of the laser light A becomes greater than or equal to 90 degrees, and the laser light A may not be optically coupled to the optical waveguide 122.

Figure 7:
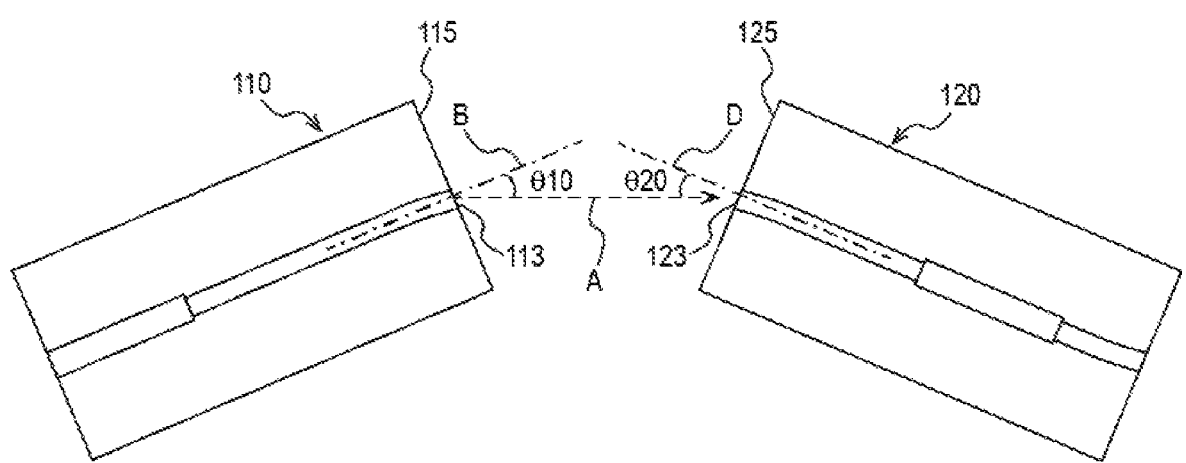
FIG. 7 is a schematic diagram illustrating an arrangement of the laser element and the optical amplifier according to the first embodiment.

FIG. 7 is a schematic diagram illustrating an arrangement of the laser element 110 and the optical amplifier 120 in the present embodiment. The laser element 110 and the optical amplifier 120 are arranged with an angle that is not linear or parallel so that the laser light A output from the output port 113 of the laser element 110 is input to the input port 123 of the optical amplifier 120. That is, the laser element 110 and the optical amplifier 120 are arranged in the directions intersecting each other, that is, arranged such that the axis B perpendicular to the output end face 115 intersects the axis D perpendicular to the input end face 125. The laser light A is emitted from the laser element 110 at the angle θ10 relative to the axis B perpendicular to the output end face 115 and enters the optical amplifier 120 at the angle θ20 relative to the axis D perpendicular to the input end face 125. In other words, the laser element 110 and the optical amplifier 120 are arranged such that the angle between the traveling direction of the laser light A and the axis B perpendicular to the output end face 115 becomes the angle θ10 and the angle between the traveling direction of the laser light A and the axis D perpendicular to the input end face 125 becomes the angle θ20. The angle θ20 is not necessarily required to be the same as the angle θ10, that is, the angle θ2 is not necessarily required to be the same angle as the angle θ1, and any angle within a tolerable range may be employed, respectively.

With such an arrangement, the laser light A output from the laser element 110 having the optical waveguide 112 nonparallel relative to the output end face 115 is optically coupled to the optical amplifier 120 having the optical waveguide 122 nonparallel relative to the input end face 125. Furthermore, with the laser element 110 and the optical amplifier 120 being arranged with an angle that is not linear or parallel, the length in the longitudinal direction of the casing 180 (that is, the traveling direction of the laser light A from the laser element 110 to the optical amplifier 120) can be reduced. An optical system such as the etalon filter 170 or the like can be provided in a location closer to the intersection part of angles between the two elements in a portion where they are arranged with an angle not linear or parallel. That is, an optical system such as the etalon filter 170 or the like can be provided in a region closer to the intersection of directions intersecting each other in which the laser element 110 and the optical amplifier 120 are arranged, respectively. Thereby, at least a part of the optical system such as the etalon filter 170 can be provided in a region interposed between the laser element 110 and the optical amplifier 120 arranged in the directions intersecting each other. Thus, it is not necessary to increase the length in the short direction of the casing 180 (that is, a direction perpendicular to the traveling direction of the laser light A from the laser element 110 to the optical amplifier 120).

In the laser module 100 according to the present embodiment, instead of the optical amplifier 120, a substrate having at least an optical waveguide may be used. In this case, the substrate may form an optical element which is not a laser element, for example, a semiconductor optical element such as an optical modulator, an optical switch, or the like. That is, the configuration of the laser module 100 according to the present embodiment can be applied to any configuration that has a laser element implemented on a first substrate and an optical element implemented on a second substrate that has an optical waveguide to which a laser light from the laser element is optically coupled.

As discussed above, in the present embodiment, in both of the laser element 110 and the optical amplifier 120 (that is, an optical element which is not a laser element), the angle at which an optical waveguide is connected to an end face is set to a predetermined angle larger than 0 degree. This can suppress a reflected light at the end face from returning to the optical waveguide, and therefore noise in the laser element 110 can be reduced, and unintended laser oscillation in the optical amplifier 120 can be reduced. Furthermore, since a substrate on which the laser element 110 is implemented and a substrate on which the optical amplifier 120 is implemented are arranged at an angle that is not linear or parallel, the size of the casing 180 can be reduced.

Second Embodiment

Figure 8:
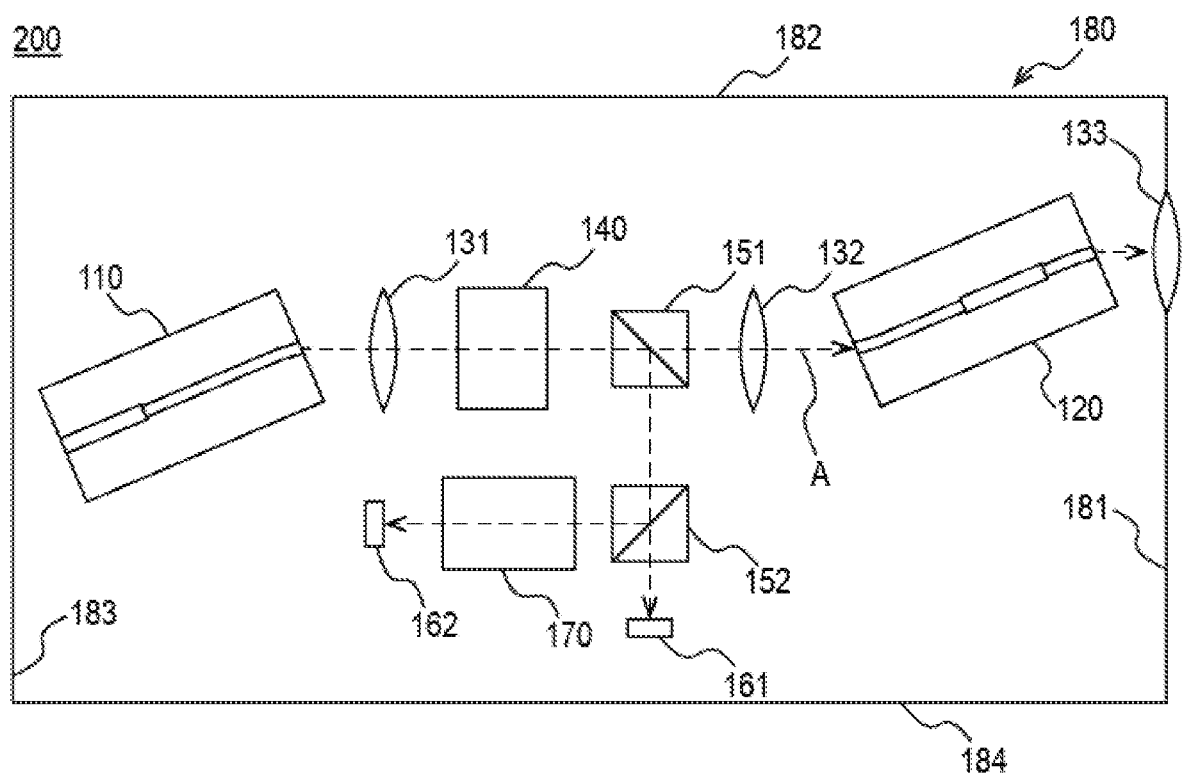
FIG. 8 is a general configuration diagram of a laser module according to a second embodiment.

FIG. 8 is a general configuration diagram of a laser module 200 according to the present embodiment. While the laser module 200 has the same components as the laser module 100 of the first embodiment, the arrangement of the optical amplifier 120 is different. Specifically, unlike the first embodiment, the optical amplifier 120 is inverted along the short direction of the casing 180.

Figure 9:
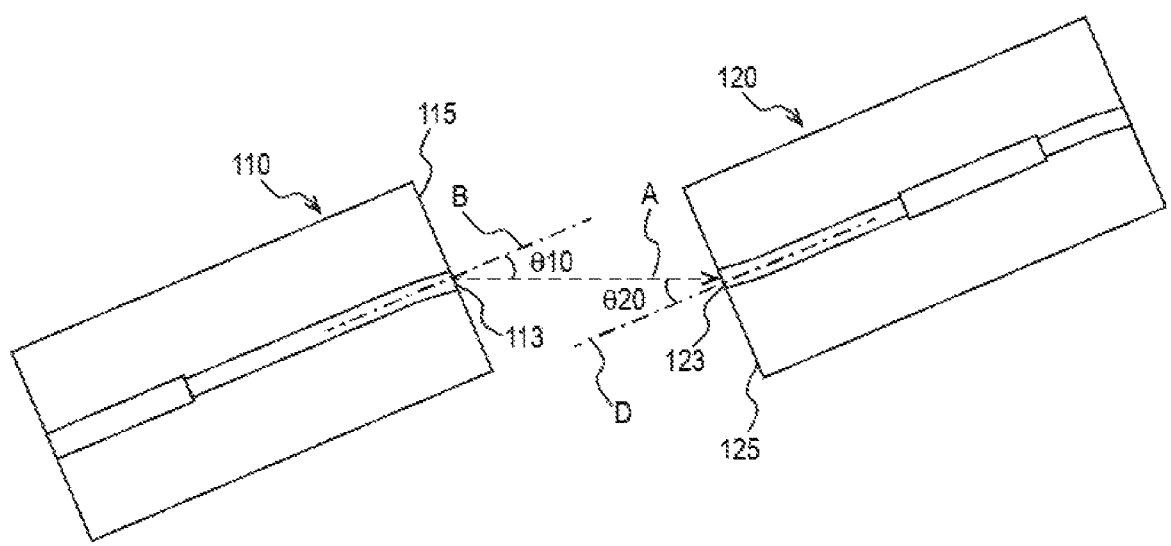
FIG. 9 is a schematic diagram illustrating an arrangement of the laser element and the optical amplifier according to the second embodiment.

FIG. 9 is a schematic diagram illustrating an arrangement of the laser element 110 and the optical amplifier 120 in the present embodiment. The laser element 110 and the optical amplifier 120 are arranged nonparallel relative to each other such that the laser light A output from the output port 113 of the laser element 110 is input to the input port 123 of the optical amplifier 120. Unlike the first embodiment, the laser element 110 and the optical amplifier 120 are not arranged at an angle that is not linear or parallel but arranged in substantially the same direction. The laser light A is emitted from the laser element 110 at the angle θ10 relative to the axis B perpendicular to the output end face 115 and enters the optical amplifier 120 at the angle θ20 relative to the axis D perpendicular to the input end face 125. In other words, the laser element 110 and the optical amplifier 120 are arranged such that the angle between the traveling direction of the laser light A and the axis B perpendicular to the output end face 115 is the angle θ10 and the angle between the traveling direction of the laser light A and the axis D perpendicular to the input end face 125 is the angle 920.

Also in the present embodiment, influence of a reflected light at an end face can be suppressed in a similar manner to the first embodiment. Further, since arrangement is not of a linear or parallel manner as in the first embodiment, although the length in the short direction of the casing 180 is slightly larger, the length in the longitudinal direction can be reduced.

Third Embodiment

Figure 10:
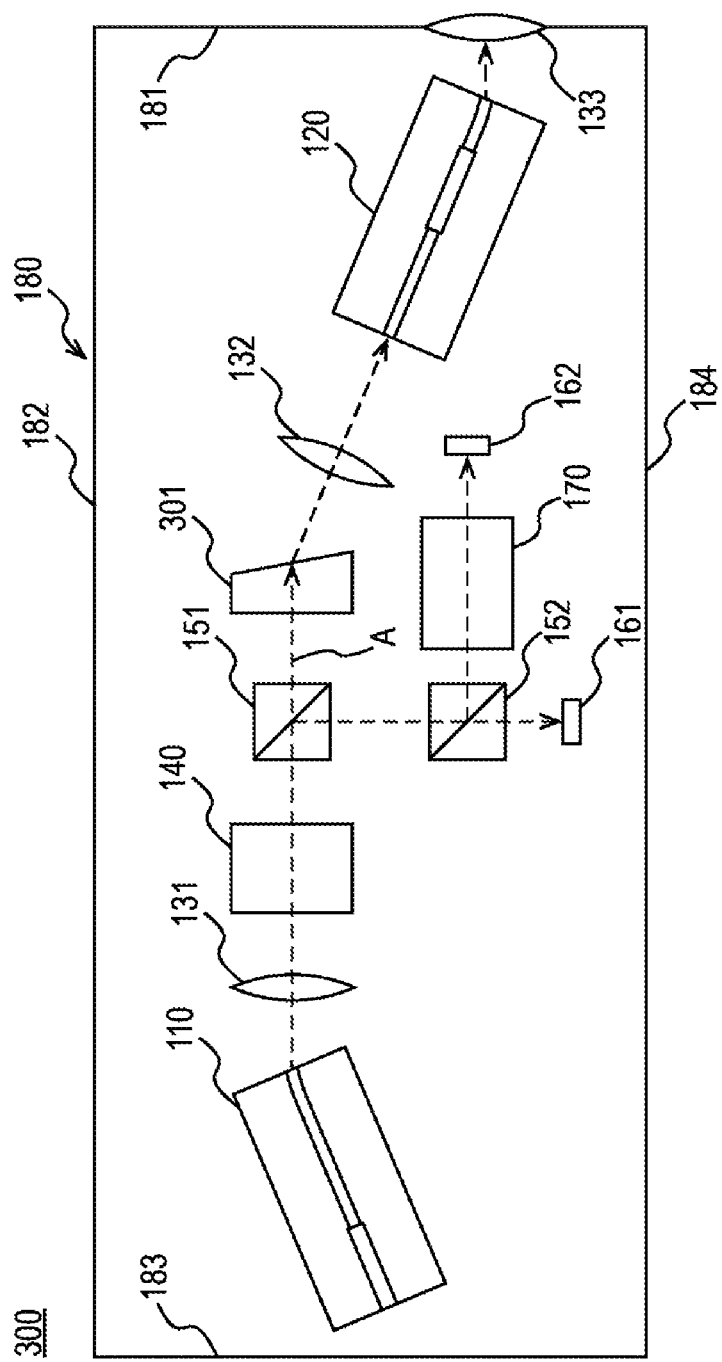
FIG. 10 is a general configuration diagram of the laser module according to a third embodiment.

FIG. 10 is a general configuration diagram of a laser module 300 according to the present embodiment. The laser module 300 is different from that of the first embodiment in that the optical waveguide 122 does not have the curved part 122b and is formed of only the first linear part 122a between the first end face (input end face) 125 side on which the input port 123 is provided and the optical amplifier unit 121. Further, because of this, the laser module 300 is partially different from that of the first embodiment in the arrangement and configuration of elements.

While, in the first and second embodiments, the case where the optical waveguide 112 is nonparallel relative to the output end face 115 in the laser element 110 and connected thereto and the optical waveguide 122 is nonparallel relative to the input end face 125 in the optical amplifier 120 and connected thereto has been described, the invention is not limited thereto. It may be sufficient that at least the optical waveguide 112 is nonparallel relative to the output end face 115 in the laser element 110 and connected thereto. For example, the optical waveguide 122 may not be nonparallel relative to the input end face 125 in the optical amplifier 120 and connected thereto.

As illustrated in FIG. 10, in the laser module 300, a prism 301 is provided in one of the directions in which the optical splitter 151 outputs the laser light A. The prism 301 refracts the laser light A so that the traveling direction of the laser light A becomes perpendicular to the input end face 125 of the optical amplifier 120. The condensing lens 132 is provided in a direction in which the prism 301 outputs the laser light A. The condensing lens 132 condenses and optically couples the laser light A refracted by the prism 301 into the optical waveguide 122 of the optical amplifier 120.

Figure 11:
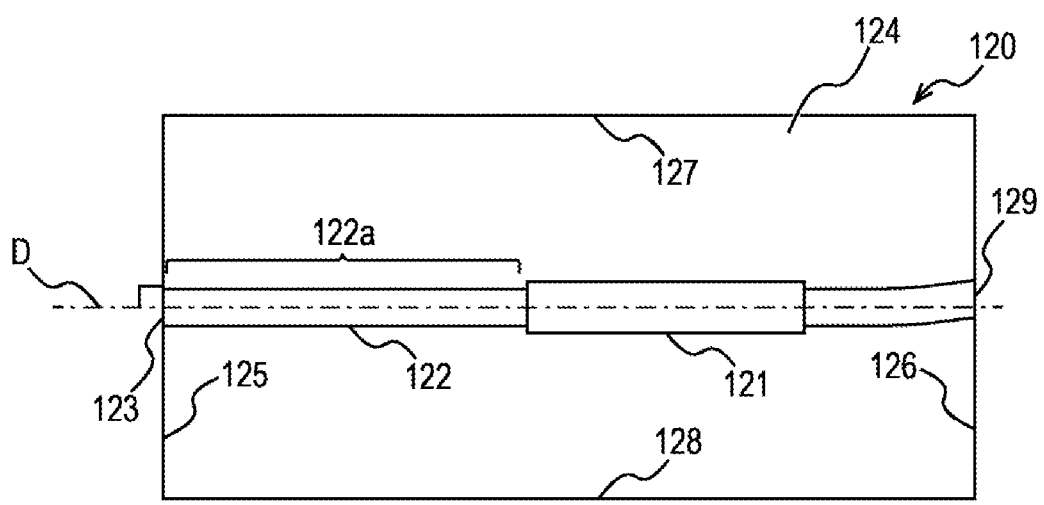
FIG. 11 is a general configuration diagram of an optical amplifier according to the third embodiment.

FIG. 11 is a general configuration diagram of the optical amplifier 120 according to the present embodiment. As illustrated in FIG. 11, the optical waveguide 122 is formed of only the first linear part 122a on the first end face (input end face) 125 side on which the input port 123 is provided, that is, between the input end face 125 and the optical amplifier unit 121. Unlike the first embodiment, the optical waveguide 122 has neither of the curved part 122b nor the second linear part 122c between the input end face 125 and the optical amplifier unit 121.

Note that, on the second end face (output end face) 126 side on which the output port 129 is provided, that is, between the optical amplifier unit 121 and the output end face 126, the optical waveguide 122 is configured in the same manner as the first embodiment. That is, the optical waveguide 122 has the same configuration as the first linear part 122a, the curved part 122b, and the second linear part 122c between the optical amplifier unit 121 and the output end face 126.

The optical waveguide 122 extends along the axis D perpendicular to the input end face 125 between the input end face 125 and the optical amplifier unit 121 and is connected perpendicularly to the input end face 125. That is, the optical waveguide 122 is connected to the input end face 125 without inclination.

The optical amplifier 120 is arranged so that the laser light A refracted by the prism 301 and condensed by the condensing lens 132 enters the optical waveguide 122 from the input port 123 along the axis D perpendicular to the input end face 125. In the present embodiment, as discussed above, the laser light A enters the optical waveguide 122 connected perpendicularly to the input end face 125 and is optically coupled to the optical waveguide 122.

The laser light A output from the optical amplifier 120 is condensed in the outside of the casing 180 by the condensing lens 133 provided in a direction in which the optical amplifier 120 outputs the laser light A in the same manner as the first embodiment.

Note that the present embodiment is different from the first embodiment in the arrangement of the optical splitter 152, the etalon filter 170, and the photodiode 162. In the present embodiment, the optical splitter 152 is arranged so as to output the laser light A in a direction on the optical amplifier 120 side as one of the directions for output. Accordingly, the etalon filter 170 and the photodiode 162 are arranged in series in a direction on the optical amplifier 120 side in which the optical splitter 152 outputs the laser light A. That is, the etalon filter 170 is provided in a direction on the optical amplifier 120 side in which the optical splitter 152 outputs the laser light A. The photodiode 162 is provided in a direction in which the etalon filter 170 outputs the laser light A.

As seen in the present embodiment, the optical waveguide 122 in the optical amplifier 120 may be connected perpendicularly to the input end face 125 so that the laser light A enters the optical waveguide 122 along the axis D perpendicular to the input end face 125.

Note that the configuration of a laser module using the optical amplifier 120 illustrated in FIG. 11 in which the optical waveguide 122 is connected perpendicularly to the input end face 125 is not limited to the configuration illustrated in FIG. 10. Other configuration examples will be described below in fourth to seventh embodiments.

Fourth Embodiment

Figure 12:
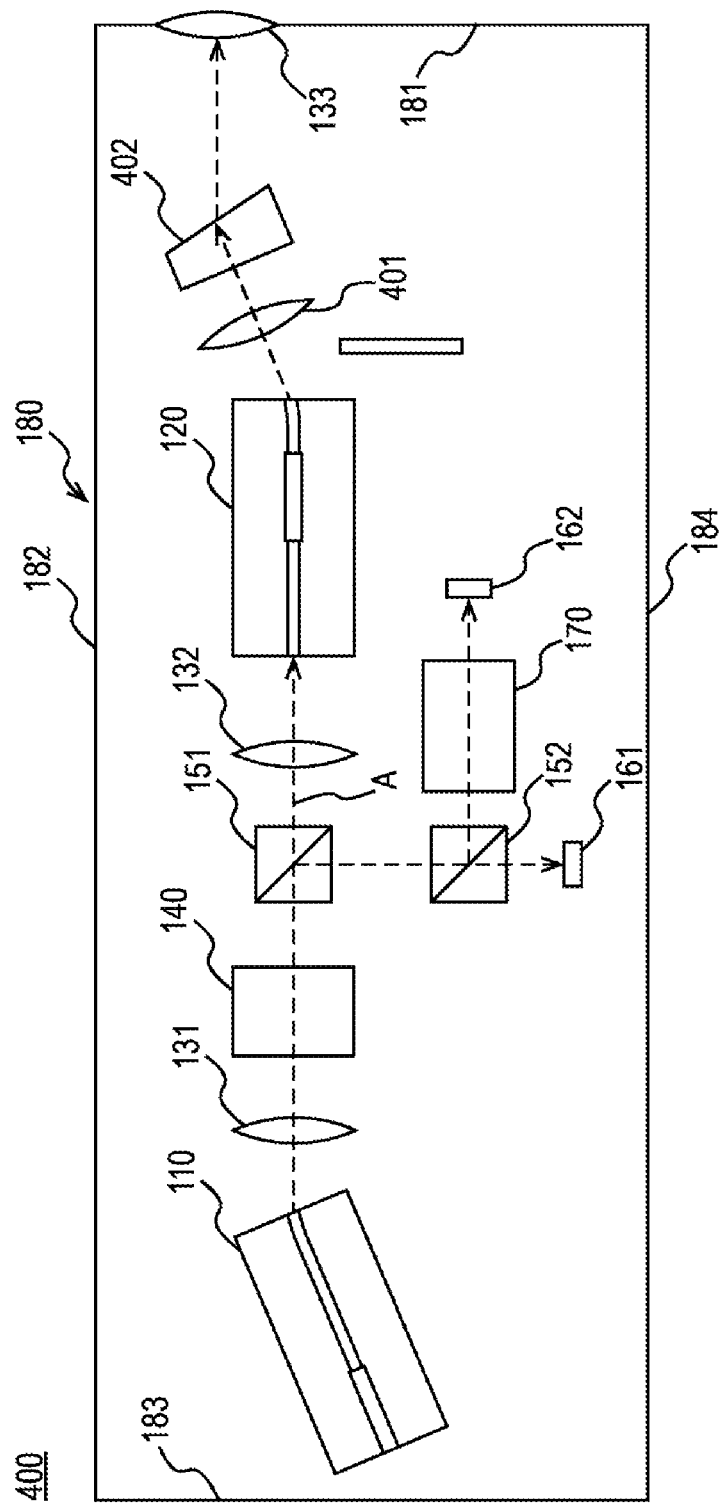
FIG. 12 is a genera configuration diagram of a laser module according to a fourth embodiment.

FIG. 12 is a general configuration diagram of a laser module 400 according to the present embodiment. In the laser module 400, the optical amplifier 120 is configured in the same manner as the third embodiment, however, the arrangement and configuration of elements are partially different from the third embodiment.

As illustrated in FIG. 12, in the laser module 400, the condensing lens 132 is provided in the same manner as the first embodiment in one of the directions in which the optical splitter 151 outputs the laser light A. In the direction in which the condensing lens 132 condenses and outputs the laser light A, the same optical amplifier 120 as that of the third embodiment illustrated in FIG. 11 is arranged.

The optical amplifier 120 is arranged so that the laser light A condensed by the condensing lens 132 enters the optical waveguide 122 from the input port 123 along the axis D perpendicular to the input end face 125.

In a direction in which the optical amplifier 120 outputs the laser light A, a condensing lens 401 and a prism 402 are provided in series. The condensing lens 401 condenses the laser light A output from the optical amplifier 120 into the prism 402. The prism 402 refracts the laser light A condensed by the condensing lens 401 toward the condensing lens 133 provided on the side wall 181 of the casing 180. The condensing lens 133 condenses the laser light A refracted by the prism 402 to the outside.

Fifth Embodiment

Figure 13:
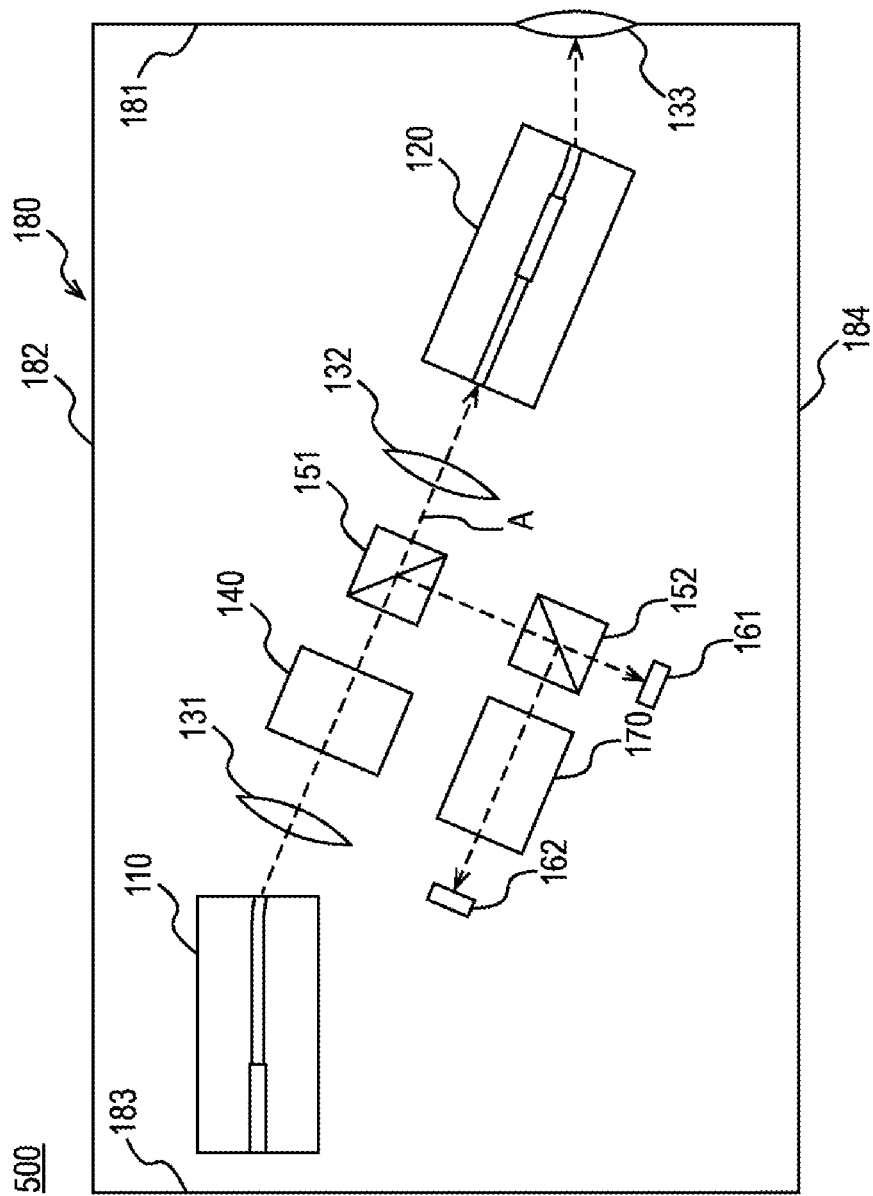
FIG. 13 is a genera configuration diagram of a laser module according to a fifth embodiment.

FIG. 13 is a general configuration diagram of a laser module 500 according to the present embodiment. In the laser module 500, the optical amplifier 120 is configured in the same manner as the third embodiment, however, the arrangement and configuration of elements are partially different from the third embodiment.

As illustrated in FIG. 13, in the laser module 500, the laser element 110, the collimate lens 131, the optical isolator 140, the optical splitter 151, and the condensing lens 132 that are the same as those in the first embodiment are provided nonparallel relative to the casing 180. Further, the optical splitter 152, the photodiodes 161 and 162, and the etalon filter 170 that are the same as those in the first embodiment are also provided nonparallel relative to the casing 180.

The same optical amplifier 120 as that of the third embodiment illustrated in FIG. 11 is arranged in a direction in which the condensing lens 132 condenses and outputs the laser light A. The optical amplifier 120 is arranged so that the laser light A condensed by the condensing lens 132 enters the optical waveguide 122 from the input port 123 along the axis D perpendicular to the input end face 125 in the same manner as the fourth embodiment.

The laser light A output from the optical amplifier 120 is condensed in the outside of the casing 180 by the condensing lens 133 provided in a direction in which the optical amplifier 120 outputs the laser light A in the same manner as the first embodiment.

Sixth Embodiment

Figure 14:
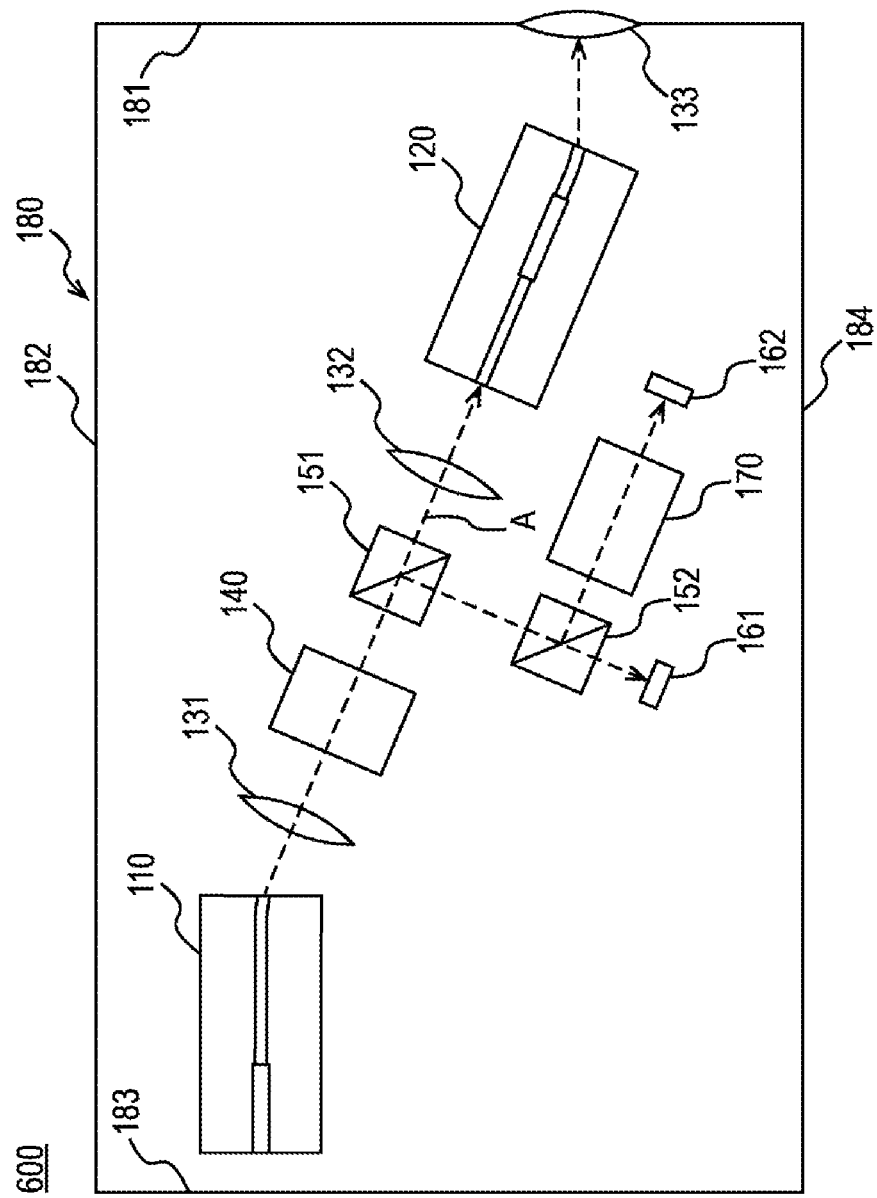
FIG. 14 is a genera configuration diagram of a laser module according to a sixth embodiment.

FIG. 14 is a general configuration diagram of a laser module 600 according to the present embodiment. The laser module 600 is different from that of the fifth embodiment in the arrangement of the optical splitter 152, the etalon filter 170, and the photodiode 162.

In the previous fifth embodiment, the optical splitter 152 is arranged so as to output the laser light A in a direction on the laser element 110 side as one of the directions to output as illustrated in FIG. 13. The etalon filter 170 and the photodiode 162 are arranged in series in a direction on the laser element 110 side in which the optical splitter 152 outputs the laser light A. That is, the etalon filter 170 is provided in a direction on the laser element 110 side in which the optical splitter 152 outputs the laser light A. The photodiode 162 is provided in a direction in which the etalon filter 170 outputs the laser light A.

In contrast, as illustrated in FIG. 14, in the laser module 600, the optical splitter 152 is arranged so as to output the laser light A in a direction on the optical amplifier 120 side as one of the directions to output the laser light A. Accordingly, the etalon filter 170 and the photodiode 162 are arranged in series in a direction on the optical amplifier 120 side in which the optical splitter 152 outputs the laser light A. That is, the etalon filter 170 is provided in a direction on the optical amplifier 120 side in which the optical splitter 152 outputs the laser light A. The photodiode 162 is provided in a direction in which the etalon filter 170 outputs the laser light A.

Seventh Embodiment

Figure 15:
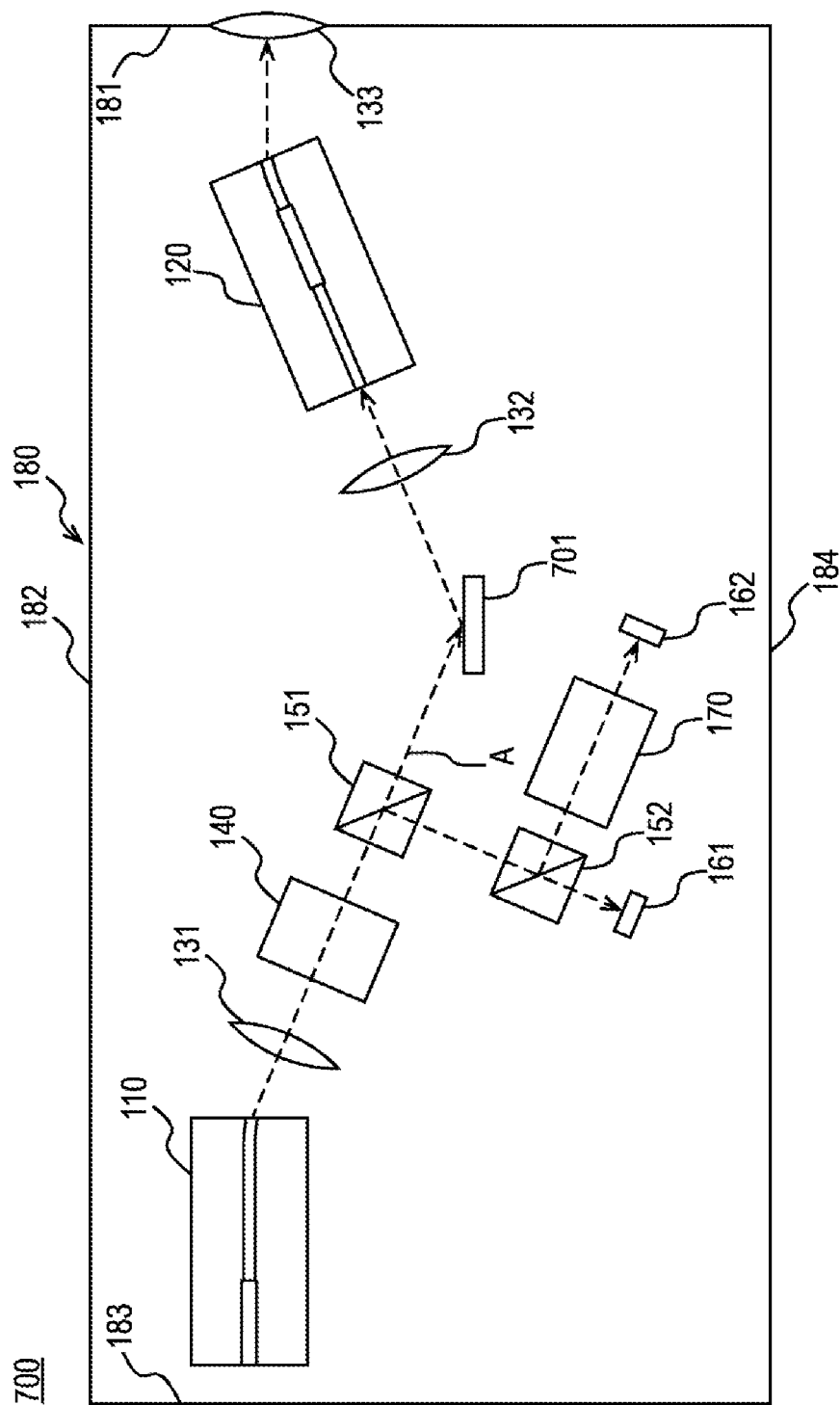
FIG. 15 is a genera configuration diagram of a laser module according to a seventh embodiment.

FIG. 15 is a general configuration diagram of a laser module 700 according to the present embodiment. The laser module 700 is different from that of the sixth embodiment in that it has a mirror 701 that reflects and guides the laser light A condensed by the condensing lens 132 to the optical amplifier 120.

As illustrated in FIG. 15, in the laser module 700, the mirror 701 is provided in one of the directions in which the optical splitter 151 outputs the laser light A. In the direction in which the mirror 701 reflects the laser light A, the condensing lens 132 that condenses the light reflected by the mirror 701 is provided.

The optical amplifier 120 is arranged so that the laser light A condensed by the condensing lens 132 reflected by the mirror 701 enters the optical waveguide 122 from the input port 123 along the axis D perpendicular to the input end face 125 of the optical amplifier 120.

The laser light A output from the optical amplifier 120 is condensed in the outside of the casing 180 by the condensing lens 133 provided in the direction in which the optical amplifier 120 outputs the laser light A. Note that the present embodiment is configured such that the optical amplifier 120 outputs the laser light A on the opposite side of that of the sixth embodiment relative to an axis perpendicular to the output end face 126.

The present invention is not limited to the embodiments described above and can be modified as appropriate within the scope not departing from the spirit of the present invention.

LIST OF REFERENCE NUMERALS 100, 200, 300, 400, 500, 600, 700: laser module
110: laser element
111: laser oscillation unit
112, 122: optical waveguide
120: optical amplifier
121: optical amplifier unit
114, 124: substrate

The invention claimed is:

1. A laser module comprising:
a laser element provided on a first substrate and having a laser oscillation unit that generates a laser light and a first optical waveguide that guides the laser light; and
an optical element provided on a second substrate and having a second optical waveguide that guides the laser light,
wherein the first optical waveguide is connected to an end face of the first substrate at a first angle that is greater than 0 degree relative to a first axis that is perpendicular to the end face of the first substrate,
wherein the first substrate and the second substrate are arranged such that an output of the laser light from the first optical waveguide is optically coupled to the second optical waveguide, the first axis of the first substrate is tilted with respect to a traveling direction of the laser light when traveling between the first and second substrates, and a second axis of the second substrate is tilted, with respect to the traveling direction, in an opposite direction or in a same direction as the first substrate, and
the second substrate having an input end surface and an output end surface and the second optical waveguide being bent toward opposite directions at a first side of the input end surface and at a second side of the output end surface in a same manner to be connected to the input end surface and the output end surface.

2. The laser module according to claim 1, wherein the first substrate and the second substrate are arranged at the same side with respect to the traveling direction.

3. The laser module according to claim 1,
wherein the first optical waveguide has a straight first linear part extending along the first axis, a bent curved part, and a straight second linear part extending along a third axis in series, and
wherein the bent curved part of the first optical waveguide is bent so that the first axis and the third axis form the first angle.

4. The laser module according to claim 1, wherein the first angle is greater than 3 degrees and less than 18.4 degrees.

5. The laser module according to claim 1, wherein the traveling direction forms a third angle relative to the first axis, and the laser light is outputted from the first optical waveguide at the third angle.

6. The laser module according to claim 5, wherein the third angle is greater than 9 degrees and less than 90 degrees.

7. The laser module according to claim 1, wherein the second optical waveguide is connected to the end face of the second substrate at a second angle greater than 0 degree relative to .athe second axis perpendicular to the end face of the second substrate.

8. The laser module according to claim 7,
wherein the second optical waveguide has a straight first linear part extending along the second axis, a bent curved part, and a straight second linear part extending along a fourth axis in series, and
wherein the bent curved part of the second optical waveguide is bent so that the second axis and the fourth axis form the second angle.

9. The laser module according to claim 7, wherein the second angle is greater than 3 degrees and less than 18.4 degrees.

10. The laser module according to claim 7, wherein the first substrate and the second substrate are arranged such that the first axis and the second axis are not parallel to each other.

11. The laser module according to claim 7, wherein a traveling direction of the laser light in a space between the laser element and the optical element forms a fourth angle relative to the second axis, and the laser light is optically coupled to the second optical waveguide at the fourth angle.

12. The laser module according to claim 11, wherein the fourth angle is greater than 9 degrees and less than 90 degrees.

13. The laser module according to claim 1, wherein the first substrate and the second substrate are arranged in directions so as to intersect each other.

14. The laser module according to claim 1, wherein the optical element is a semiconductor amplifier that amplifies the laser light.

15. The laser module according to claim 1, wherein, on the first substrate and the second substrate, different temperature adjustment elements for adjusting temperatures of the first substrate and the second substrate are provided, respectively.

* * * * *